United States Patent
Likins et al.

(10) Patent No.: US 6,803,653 B1
(45) Date of Patent: Oct. 12, 2004

(54) APPARATUS FOR SUPPRESSING PACKAGED SEMICONDUCTOR CHIP CURVATURE WHILE MINIMIZING THERMAL IMPEDANCE AND MAXIMIZING SPEED/RELIABILITY

(75) Inventors: Robert E. Likins, Saratoga, CA (US); Richard C. Blish, II, Saratoga, CA (US); Sharad M. Shah, San Jose, CA (US); Sidharth Sidharth, San Jose, CA (US); Devendra Natekar, Boulder, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 346 days.

(21) Appl. No.: 10/010,392

(22) Filed: Dec. 7, 2001

(51) Int. Cl.$^7$ ............................................... H01L 23/34
(52) U.S. Cl. ...................... 257/707; 257/666; 257/778; 257/796; 438/122
(58) Field of Search ................................. 257/666, 706, 257/707, 720, 778, 780, 796; 438/122

(56) References Cited

U.S. PATENT DOCUMENTS

| | | | |
|---|---|---|---|
| 5,397,746 A | | 3/1995 | Blish, II ..................... 437/209 |
| 5,489,801 A | | 2/1996 | Blish, II ..................... 257/675 |
| 5,811,317 A | * | 9/1998 | Maheshwari et al. ......... 29/827 |
| 6,015,722 A | * | 1/2000 | Banks et al. ................ 438/108 |
| 6,313,521 B1 | * | 11/2001 | Baba .......................... 257/678 |
| 6,323,547 B1 | * | 11/2001 | Kawamura et al. ......... 257/688 |
| 6,465,827 B2 | * | 10/2002 | Tanaka et al. .............. 257/295 |

FOREIGN PATENT DOCUMENTS

JP 05275580 A * 10/1993

* cited by examiner

Primary Examiner—Tom Thomas
Assistant Examiner—Chris Chu

(57) ABSTRACT

A semiconductor structure includes a substrate and a semiconductor devices secured to the substrate. A stabilizing member is secured to the semiconductor device, and has a coefficient of thermal expansion which is substantially the same as the coefficient of thermal expansion of the substrate. The bending stiffness of the substrate is substantially the same as the bending stiffness of the stabilizing member, wherein:

bending stiffness=$Et^3$, with E=Young's modulus, and t=thickness.

In another embodiment, a stabilizing member is secured to the substrate, and has a coefficient of thermal expansion which is substantially the same as the coefficient of thermal expansion of the die. The bending stiffness of the die is substantially the same as the bending stiffness of the stabilizing member, with bending stiffness defined as above.

10 Claims, 4 Drawing Sheets

APPARATUS FOR SUPPRESSING PACKAGED SEMICONDUCTOR CHIP CURVATURE WHILE MINIMIZING THERMAL IMPEDANCE AND MAXIMIZING SPEED/RELIABILITY

BACKGROUND OF THE INVENTION

1. Field of the Invention

This invention relates generally to semiconductor structure, and more particularly, to structure for suppressing semiconductor chip curvature and reducing chip temperature while improving device speed and reliability.

2. Discussion of the Related Art

FIG. 1 illustrates a typical high-power semiconductor device in the form of a silicon chip or die 12 mounted and secured to a ceramic, for example, alumina, substrate 14. In order to mount and secure the semiconductor die 12 to the substrate 14, the die 12 and substrate 14 are positioned as shown in FIG. 1 and the temperature of these components is raised until the solder balls 16 on the underside of the die 12 and corresponding solder pads on the substrate 14 melt or liquefy sufficiently to form solder connections between the die 12 and substrate 14. Then, the structure is cooled so that the solder connections solidify and the die 12 is secured to the substrate 14.

While the solder is still in liquid form, the substrate 14 and die 12 remain in their original, substantially flat configuration. However, once the solder solidifies, securing the die 12 to the substrate 14, as the assembly is further cooled and both the die 12 and substrate 14 contract, a difference in coefficient of thermal expansion between the die 12 and the substrate 14 will cause the die 12-substrate 14 assembly to bend in the same manner as a bimetal strip.

In a typical prior art system such as described above, with silicon having a coefficient of thermal expansion of 3 ppm/° C., and alumina having a coefficient of thermal expansion of 7 ppm/° C., as the assembly is cooled from the solidifying temperature of the solder to room temperature, the alumina, for a given change in temperature, contracts more than the silicon, causing the assembly to bend so that the top surface 17 of the die 12 is slightly domed (FIG. 2).

Subsequently, after application of a thermal grease 18 or the like to the exposed surface 17 of the die 12, a heat sink 22 having a flat bottom surface 24 is positioned as shown in FIG. 2. The difference between the thermal expansion of the silicon (3 ppm/° C.) and the alumina (7 ppm/° C.) is small enough so as to cause only a slight doming effect of the die 12 (with for example the peak being raised 15 μm as compared to an edge of the die 12). Thus, the entire surface 24 of the heat sink 22 can be brought into close proximity with the entire surface 17 of the die 12. With no substantial gaps between the surface 17 and surface 24, good thermal conductivity is provided from the die 12 through the thermal grease 18 to the heat sink 22, as is desired.

However, in modern semiconductor structures wherein an organic substrate 30 is chosen (FIG. 3), the coefficient of thermal expansion thereof (for example, 18 ppm/° C.) is substantially greater than for alumina. The difference between the thermal expansion of the silicon (3 ppm/° C.) and the organic substrate material (18 ppm/° C.) is sufficient to cause substantial bending of the die-substrate assembly as it is cooled. When eutectic solder or lead-free solder is substituted for high lead solder for the balls 16, while the melting point (liquidus) of the eutectic solder or lead free solder is lower than that of lead-based solder, the solidus temperature is nearly the same for all such compositions and only solidus temperature (complete solidification) is relevant to the amount of bending that will be produced as the assembly is cooled. The problem is magnified when eutectic solder is substituted for lead based solder of the balls 16. This bending causes a large doming effect of the die 12 (with the peak being raised for example approximately 50 μm as compared to an edge of the die 12). Then, after application of a thermal grease 18 or the like to the surface 17 of the die 12, when a heat sink 22 is brought into position as shown in FIG. 4, while good thermal contact is made between the center of the die 12 and the heat sink 22, there exist substantial gaps 32 between the die 12 and the heat sink 22 adjacent the edges of the die 12. Thus, near the edges of the die 12, heat from the die 12 is not properly transferred to the heat sink 22. It is to be noted that proper heat dissipation from near the edges of the die 12 is extremely important, as the high power input/outputs of the die 12 are positioned adjacent the edges thereof. Yet these are the areas where the gaps 32 between the die 12 and heat sink 22 are greatest, causing the poorest transfer of heat from the die 12 to the heat sink 22.

Therefore, what is needed is apparatus for providing that heat from a semiconductor die is properly transferred to a heat sink in close association therewith, even with a substantial difference in coefficient of thermal expansion between the die and a substrate on which it is mounted.

SUMMARY OF THE INVENTION

In accordance with the present invention, a semiconductor structure includes a substrate and a semiconductor device secured to the substrate. A stabilizing member is secured to the semiconductor device, with the semiconductor device between the stabilizing member and the substrate. The bending stiffness of the substrate is substantially the same as the bending stiffness of the stabilizing member, wherein:

bending stiffness=$Et^3$, with E=Young's modulus, and t=thickness.

The coefficient of thermal expansion of the substrate is substantially the same as the coefficient of thermal expansion of the stabilizing member.

In another embodiment, a stabilizing member is secured to the substrate, with the substrate between the die and the stabilizing member. The bending stiffness of the die is substantially the same as the bending stiffness of the stabilizing member, wherein bending stiffness is defined as above. In this embodiment, the coefficient of thermal expansion of the die is substantially the same as the coefficient of thermal expansion of the stabilizing member.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
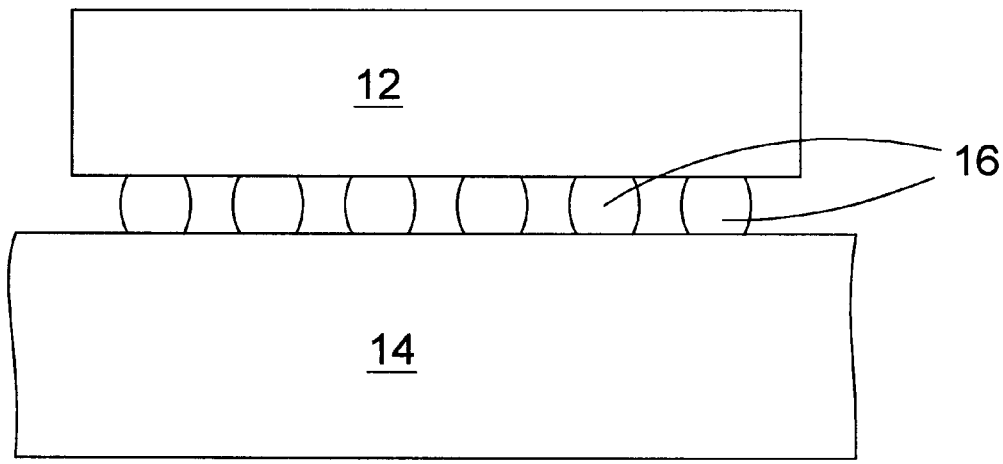
FIG. 1 is a sectional view of a prior art semiconductor structure.
Figure 2:
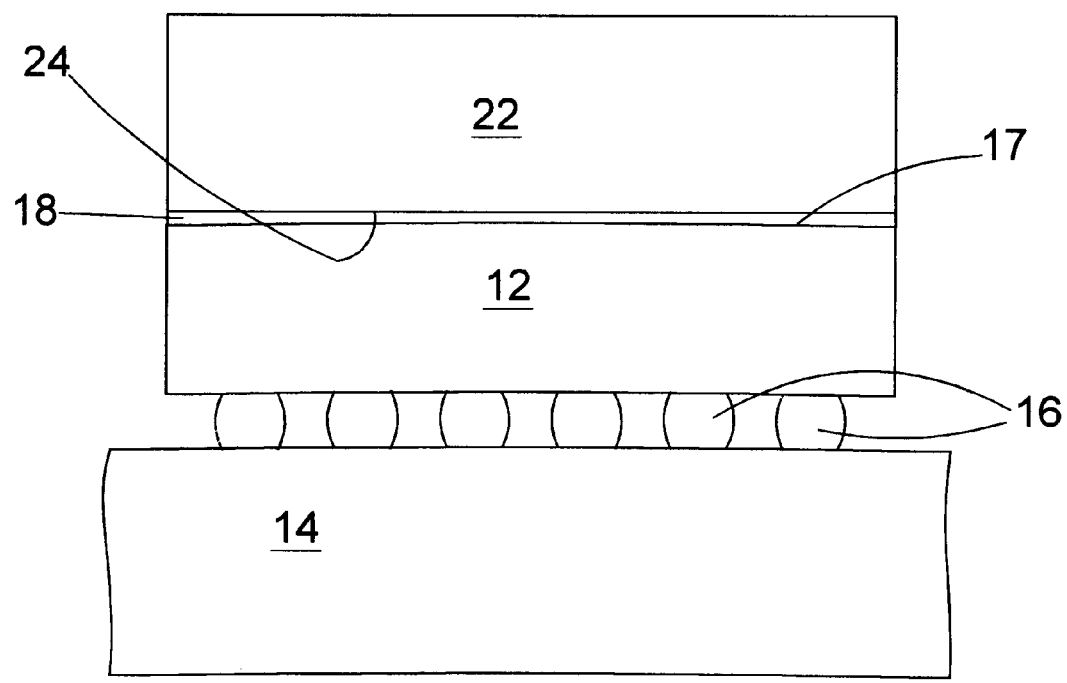
FIG. 2 is a view similar to that shown in FIG. 1, showing the structure reduced in temperature and further showing application of a heat sink thereto.
Figure 3:
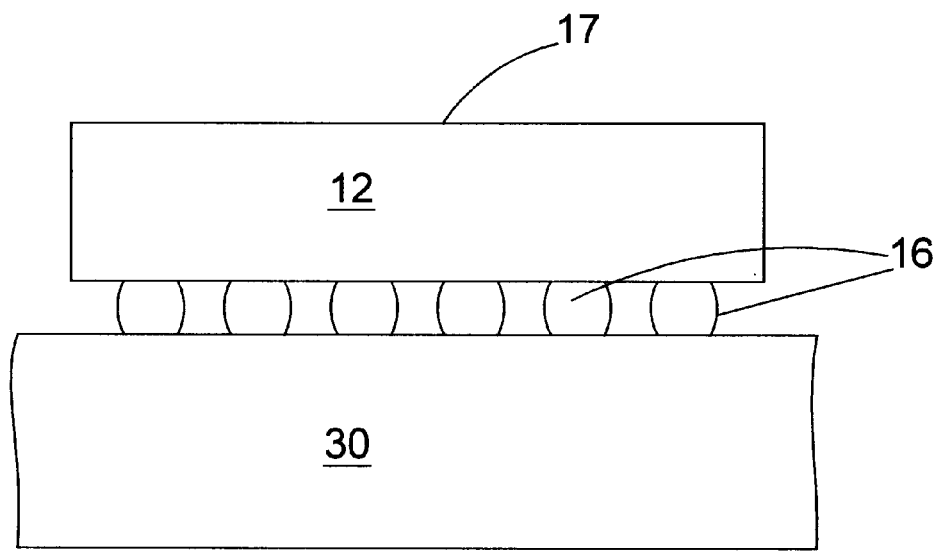
FIG. 3 is a sectional view of another prior art semiconductor structure.
Figure 4:
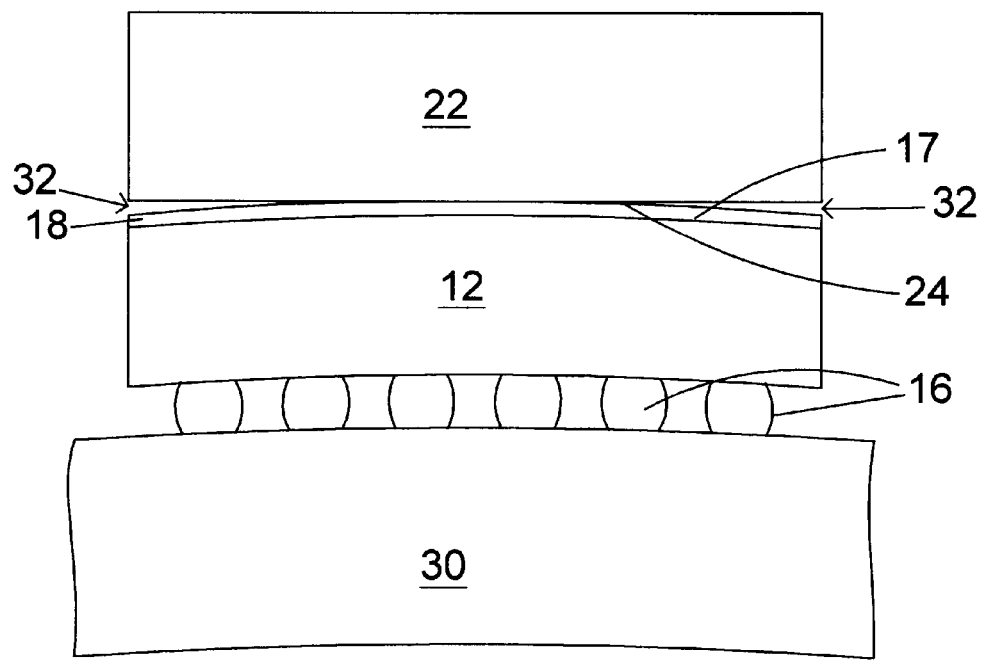
FIG. 4 is a view similar to that shown in FIG. 3, showing the structure reduced in temperature and further showing application of a heat sink thereto.
Figure 5:
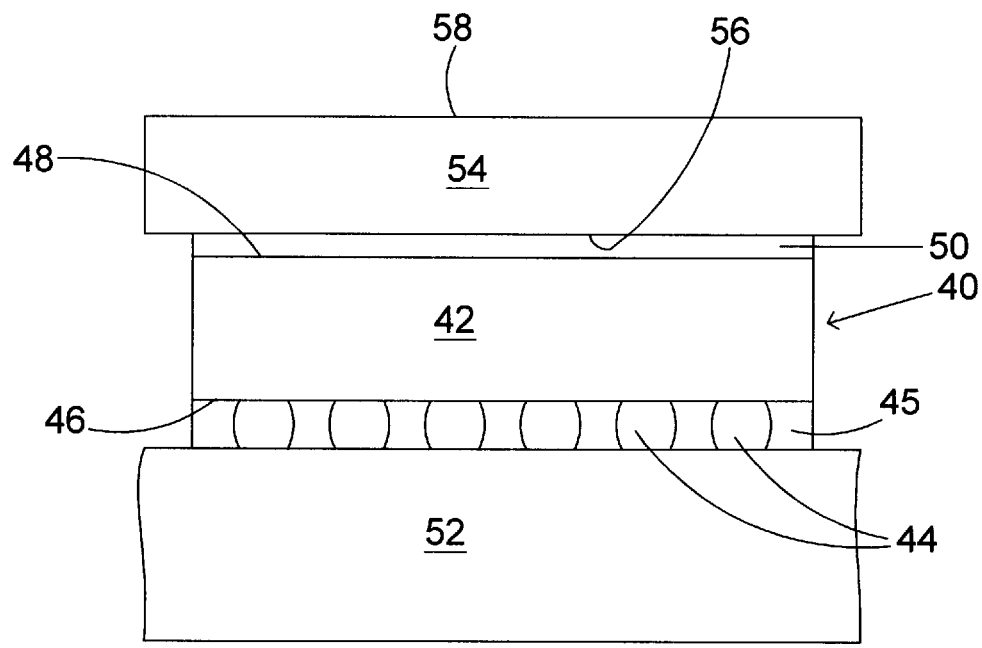
FIG. 5 is a sectional view of a semiconductor structure incorporating the present invention.

FIG. 5 illustrates semiconductor structure 40. The structure 40 includes a semiconductor device 42 in the form of a silicon chip or die having solder balls 44, for example of eutectic material, extending from one side 46 thereof, as is well-known. The other side 48 of the die 42 has secured thereto as part of the semiconductor structure 40 a member 50. Further included as part of the semiconductor structure 40 is an organic substrate 52 (which may be single- or multi-layered, and a stabilizing member 54 having a flat surface 56 secured to the member 50, and an opposite, exposed flat surface 58. It will be seen that the stabilizing member 54 is secured to the die 42 by the member 50.

As noted above, the organic substrate 52 has a coefficient of thermal expansion of, for example, 18 ppm/° C., and the silicon die 42 has a coefficient of thermal of expansion of, for example, 3 ppm/° C. Additionally, the bending stiffness of the substrate 52 can be calculated as:

$$\text{bending stiffness} = Et^3$$

where E=modulus of elasticity (Young's modulus) of the material of the substrate 52 and t=thickness of the substrate 52. A typical organic material of the substrate 52 described may have for example an out-of-plane Young's modulus of 10 GPa (the organic substrate 40 is an orthotropic material which has different in-plane and out-of-plane Young's modulus values).

The material chosen for the member 50 has a high thermal conductivity and a high Young's modulus, and also has a coefficient of thermal expansion similar to that of the substrate 52. For example, silver filled epoxy die attach material with a Young's modulus of 5 GPa may with advantage be used The stabilizing member 54 is chosen of a material having high thermal conductivity and a coefficient of thermal expansion similar to or substantially the same as that of the substrate 52. For example, aluminum, nickel, copper, or other appropriate material, can be used for the stabilizing member 54.

Once the material for the stabilizing member 54 is chosen, the thickness thereof is calculated so that the bending stiffness of the stabilizing member 54 matches, i.e. is similar to or substantially the same as, the bending stiffness of the substrate 54, wherein again the bending stiffness of the stabilizing member is:

$$\text{bending stiffness} = Et^3$$

where E=Young's modulus of the material of the stabilizing member 54 and t=thickness of the stabilizing member 54. One might also use more sophisticated approaches, such as allowing for difference in Poisson's ratio between the stabilizing member 54 and other material, and Finite Element Analysis to refine the estimate for stabilizer thickness, especially to comprehend the mechanical properties of the interfacial adhesives.

In order to mount and secure the die 42 to the substrate 52, the components of the semiconductor structure 40 are positioned as shown in FIG. 5. It will be seen that the die 42 is positioned between the substrate 52 and the stabilizing member 54. In one process, the temperature of these components then is raised until the solder balls 44 on the side 46 of the die 42 and corresponding solder pads on the substrate 52 melt or liquefy sufficiently to form solder connections between the die 42 and substrate 52, while the member 50 cures simultaneously. The structure is then cooled so that the solder connections solidify and the die 42 is secured to the substrate 52. In another process, a stabilizing member 52 attach step would occur at a lower temperature after attachment of the die 42 to the substrate 52. In either case, subsequent to the solder solidifying, a silica-containing polymer material 45 having a coefficient of thermal expansion substantially the same as the solder is provided in the voids between the substrate 52 and die 42.

Figure 6:
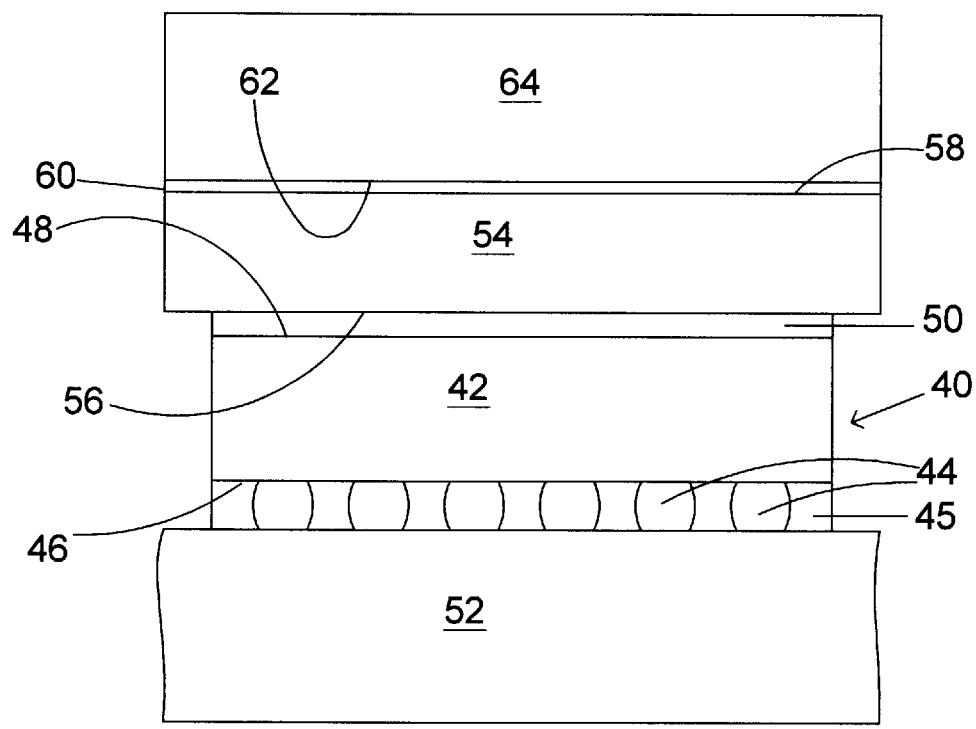
FIG. 6 is a sectional view similar to that shown in FIG. 5, showing the structure reduced in temperature and further showing application of a heat sink thereto.

Similar to the prior description, while the solder is still in liquid form, the substrate 52 and die 42 remain in their original, substantially flat configuration. Again, however, once the solder solidifies, securing the die 42 to the substrate 52, as the assembly is further cooled, the difference in coefficient of thermal expansion between the die 42 and substrate 52 provides a bending force to the die-substrate assembly. However, with the stiffness of the substrate 52 and stabilizing member 54 being substantially the same, and with the coefficient of thermal expansion of the stabilizing member 54 and the substrate 52 also being substantially the same, bending force of the die 42-substrate 52 combination is substantially equal in magnitude to, but opposite in direction from, the bending force of the stabilizing member 54-die 42 combination. With these bending forces substantially equal but in opposite directions, the surface 58 of the stabilizing member 54 remains flat as the semiconductor structure 40 cools, and indeed retains its flatness at operating and the lower temperatures. Then, with no doming effect present after application of a thermal grease 60 or the like to the surface 58 of the stabilizing member 54, when the flat surface 62 of a heat sink 64 is brought into position as shown in FIG. 6, good thermal contact is made across the whole surface 58 of the stabilizing member 54, with no gaps between the heat sink 64 and the stabilizing member 54. And, as noted above, with the member 50 secured to the die 42 and stabilizing member 54, and with the member 50 and stabilizing member 54 both having high thermal conductivity, proper heat transfer between the die 42 and heat sink 64 is achieved.

Proper selection of the material of the stabilizing member 54 allows one to provide a thickness thereof which is less than the thickness of the substrate 52. For example, as noted above, the organic substrate 52 may for example have a Young's modulus of approximately 10 GPa. If, for example, copper, with a Young's modulus substantially higher, for example, approximately 100 GPa, is chosen for the stabilizing member 54, for a given the thickness $t_1$ of the substrate 52, in accordance with the above formula for bending stiffness, the stabilizing member 54 would properly have a thickness of approximately 0.5 $t_1$ to achieve a bending stiffness substantially equal to that of the substrate 52.

It will be seen at that the problems set forth above are overcome with the present invention. With the surface 58 of the stabilizing member 54 exposed to the heat sink 64 remaining flat, the problems described above are of avoided, so that proper heat transfer are from the die 42 to the heat sink 64 is achieved, and operational speed, reliability and quality of the device 42 are maintained.

Stabilizing member 54 may be substantially larger than die 42 if mechanical connections further removed from the die 42 are high compliance (low Young's modulus), such that these external connections don't perturb the stresses in the vicinity of the die 42. Furthermore, the structure may be a multichip module, wherein each chip may have its own stabilizing member associated therewith to mitigate bending.

Figure 7:
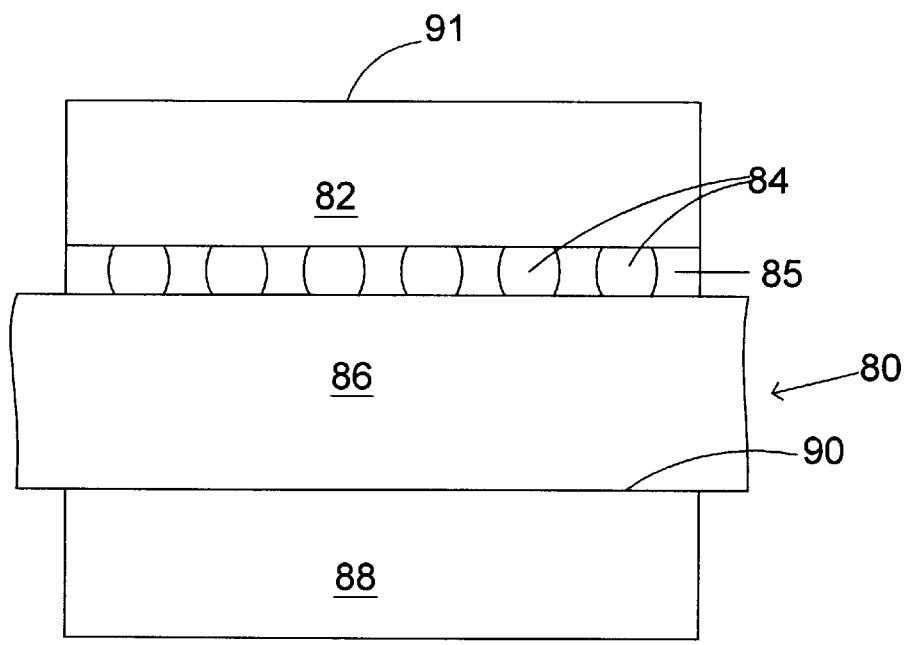
FIG. 7 is a sectional view of a semiconductor structure incorporating another embodiment of the present intention.
Figure 8:
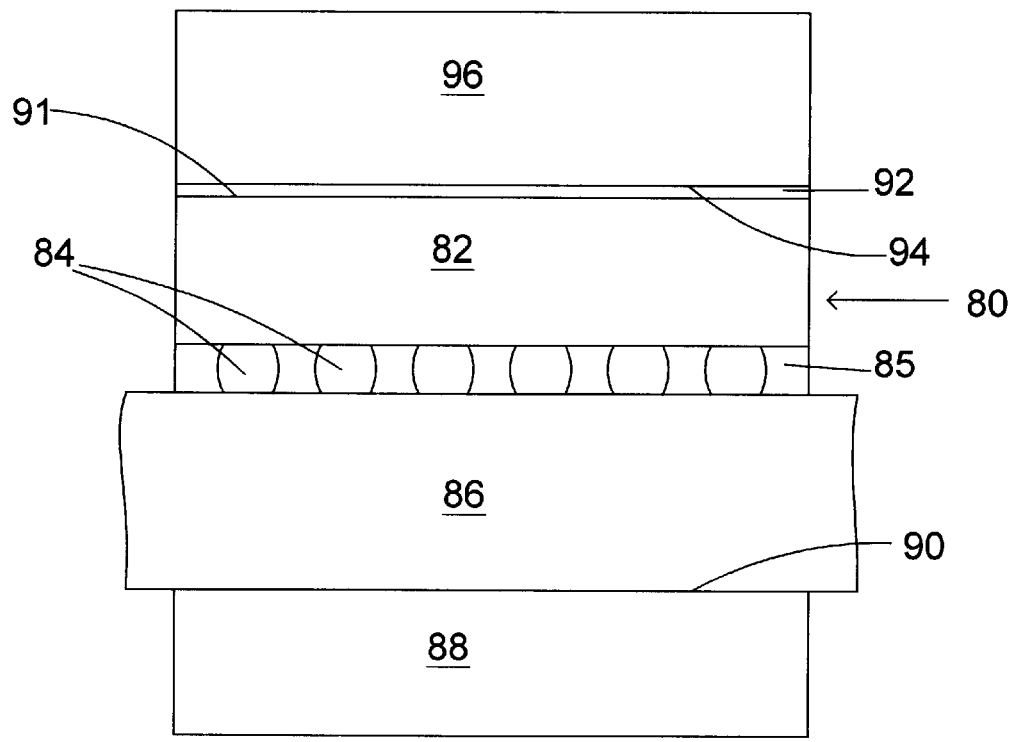
FIG. 8 is a sectional view similar to that shown in FIG. 7, showing the structure reduced in temperature and further showing application of a heat sink thereto.

It will be understood that the stabilizing member 54 may with advantage be a lid member of the semiconductor structure 40, FIGS. 7 and 8 show another embodiment of the invention. As shown therein, a structure 80 includes a semiconductor device 82 in the form of the silicon chip or die having solder balls 84, for example of eutectic material, extending from one side thereof and surrounded by polymer material 85 of substantially the same coefficient of thermal expansion. Further included as part of the semiconductor structure 80 is an organic substrate 86, and a stabilizing member 88 having a flat surface 90 secured to the side of the substrate 86 opposite the die 82. As noted above, the die 82 has a coefficient of thermal expansion of, for example, 3 ppm/° C. Additionally, the bending stiffness of the die 82 can be calculated as bending stiffness=$Et^3$ The stabilizing member 88 is chosen of a material having a coefficient of thermal expansion similar to were substantially the same as that of the die 82. For example, molybdenum or tungsten can be used for the stabilizing member 88.

Once the material for the stabilizing member 88 is chosen, the thickness thereof is calculated so that the bending stiffness of the stabilizing member 88 matches, i.e., is similar to or substantially the same as, the stiffness of the die 82, wherein again the stiffness of the stabilizing member 88 is bending stiffness=$Et^3$ It will be seen that in this environment, as the assembly is cooled, with the coefficient of thermal expansion of the die 82 and stabilizing member 88 being substantially the same, and with the bending stiffness of the die 82 being substantially the same as the bending stiffness of the stabilizing member 88, bending force of the die 82-substrate 86 combination is substantially equal in magnitude to and opposite in direction from the bending force of the stabilizing member 88-substrate 86 combination. With these bending forces substantially equal but in opposite directions, the surface 91 of the die 82 remains flat as the semiconductor structure 80 cools, and indeed retains its flatness at operating and lower temperatures. Then, with no doming effect present, after application of a thermal grease 92 or the like to the surface 91 of the die 82, when the flat surface 94 of the heat sink 96 is brought into position as shown in FIG. 8, good thermal contact is made across the whole surface 91 of the die 82, with no gaps between the heat sink 96 and the die 82.

The foregoing description of the embodiment of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A semiconductor structure comprising:
   a substrate;
   a semiconductor device secured to the substrate; and
   a stabilizing member secured to the semiconductor device;
   the bending stiffness of the substrate being generally similar to the bending stiffness of the stabilizing member, wherein;
   bending stiffness=$Et^3$, with E=Young's modulus, and t=thickness;
   wherein Young's modulus of the stabilizing member is greater than Young's modulus of the substrate.

2. The structure of claim 1 wherein the coefficient of thermal expansion of the substrate is generally similar to the coefficient of thermal expansion of the stabilizing member.

3. The structure of claim 1 wherein the bending stiffness of the substrate is substantially the same as the bending stiffness of the stabilizing member.

4. The structure of claim 3 wherein the coefficient of thermal expansion of the substrate is substantially the same as the coefficient of thermal expansion of the stabilizing member.

5. The structure of claim 4 wherein the semiconductor device is positioned between the substrate and the stabilizing member.

6. The structure of claim 5 and further comprising a member of high modulus of elasticity securing the semiconductor device to the stabilizing member.

7. The structure of claim 1 wherein the semiconductor device is positioned between the substrate and the stabilizing member.

8. The structure of claim 1 and further comprising a member of high modulus of elasticity securing the semiconductor device to the stabilizing member.

9. The structure of claim 1 wherein the stabilizing member has high thermal conductivity.

10. The structure of claim 1 wherein the stabilizing member is a lid member.

* * * * *